United States Patent [19]

Laude

[11] Patent Number: 4,495,537
[45] Date of Patent: Jan. 22, 1985

[54] CONTROLLED CURRENT LIMITER
[75] Inventor: David P. Laude, Indialantic, Fla.
[73] Assignee: Harris Corporation, Melbourne, Fla.
[21] Appl. No.: 493,234
[22] Filed: May 10, 1983
[51] Int. Cl.³ .................................................. H02H 3/08
[52] U.S. Cl. ........................................ 361/98; 361/101; 323/278
[58] Field of Search ..................... 361/18, 91, 98, 101; 323/274, 276, 278, 299

[56] References Cited

U.S. PATENT DOCUMENTS

| | | | |
|---|---|---|---|
| 3,668,545 | 6/1972 | Von Recklinghausen | 330/207 P |
| 3,737,800 | 6/1973 | Russell et al. | 330/207 P |
| 3,967,207 | 6/1976 | Wheatley, Jr. | 330/23 |
| 4,156,150 | 5/1979 | Harrigan et al. | 323/278 X |

FOREIGN PATENT DOCUMENTS 1012980  12/1965  United Kingdom ................. 323/278
918942   4/1982   U.S.S.R. ............................. 323/274

OTHER PUBLICATIONS

"Shorted Load Folds Back Supply Current", —Stopka, Electronics, Jun. 21, 1971, p. 65.
"Regulator for Standby Supply Handles Large Load Currents", —Allen, Electronics, 12/20/1973, pp. 115–116.

Primary Examiner—Harry E. Moose, Jr.
Attorney, Agent, or Firm—Barnes & Thornburg

[57] ABSTRACT

A controlled current limiter having a diode in series with the voltage divider of the current limiting transistor to prevent power dissipation during idle conditions. A switch responsive to the output current is in series with the diode. A clamp responsive to preselected voltage differences clamps the limited current to a fixed valve.

5 Claims, 6 Drawing Figures

1

CONTROLLED CURRENT LIMITER

BACKGROUND OF THE INVENTION

The present invention relates generally to current limiting protection circuits for the output of an amplifier, and more specifically to an improved controlled current limiter circuit.

A known and often used method of limiting current in a linear solid state circuit for the prevention of device failure either due to excessive current and/or excessive power is shown in FIG. 1. This circuit is generally used to protect the output of an operational amplifier from damage when the input is mishandled for example, by a short circuit to ground. The input to the input transistor Q1 is the output current of the operational amplifier. Under normal operations, the base to emitter voltage of the limiting transistor Q2 is less than that which would turn it on. When the output is grounded, Q2 turns on to limit the base voltage to Q1. The output current is limited to the base to emitter voltage of Q2 divided by the value of the resistance R1.

A typical example of a prior art device similar to that of FIG. 1 is shown in U.S. Pat. No. 3,967,207. The use of a diode and series resistor to provide current limiting once the breakdown voltage of the diode is achieved is illustrated in U.S. Pat. No. 3,737,800.

The prior art circuit FIG. 1 has three substantial shortcomings. The first is that the output current varies directly with the base-emitter voltage which is highly temperature dependant. Secondly the output current varies inversely with the value of the resistor R1. Since R1 is a small value for a high enough output current to make the circuit useful, it is implemented in monolithic circuits with a highly doped diffusion. This high doping gives a small value resistance and resonable size. The resistance increases substantially with temperature rises. The third disadvantage is that the output current during mishandling stays nearly constant when the source voltage $V_{CC}$ is increased. This means power dissipation is approximately proportional to the source voltage $V_{CC}$ during mishandling.

In an effort to make the current limiter more responsive to the difference between a source and output voltage, a voltage divider has been provided at the base of the limiting transistor Q2 as illustrated in FIG. 2. This includes resistors R2 and R3. A diode Z1 is provided at the base of the transistor Q2 to help determine the voltage at which the current limiting occurs. The limiting circuit of FIG. 2 is described specifically in U.S. Pat. No. 3,668,545. Although being an improvement over the prior art structure FIG. 1, the voltage divider R1 and R3 during normal use provides a current path between the source $V_{CC}$ and thus has power dissipation. Also the prior art circuit of FIGS. 1 and 2 do not provide a fixed minimum current when the difference between the source voltage $V_{CC}$ and the output voltage becomes extremely high.

SUMMARY OF THE INVENTION

An object of the present invention is to provide an improved current limiting circuit wherein the current limiter is responsive to the voltage difference between the source and the output voltage and does not dissipate power prior to limiting.

Another object of the present invention is to provide a current limiter which is responsive to the voltage difference between the source and output voltage as well as limiting the output current to a given value at an extremely high voltage.

These and other objects of the invention are obtained by providing a diode in series with the voltage divider connected to the base of the limiting transistor. The diode not only defines the voltage difference between the source and output voltage in which the current limiter may become operable but also prevents power dissipation of the voltage divider prior to a minimum voltage difference between the source voltage and the output voltage. A switch may be provided in series with a voltage divider and diode and is responsive to the current in the emitter collector path of the input transistor to enable the diode and voltage divider. A second diode and series resistor may be provided in series between the gate of the switch and the output terminal to bias up the gate at a voltage which exceeds break down voltage of the first diode to permit the switch to be activated at a lower output current. A clamp may also be provided across the voltage divider to clamp the output to a fixed current difference of the source voltage and the output voltage exceeding the predetermined voltage which is greater than the breakdown voltage of the first diode.

Other objects, advantages, and novel features of the present inventions will become apparent from the following detailed description of the invention when considered in conjunction with the accompaning drawings.

DESCRIPTION OF THE PREFERRED EMBODIMENTS

Figure 3:
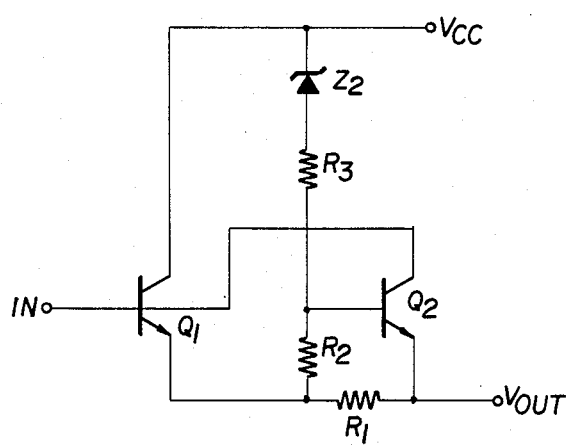
FIG. 3 is a schematic of the current limiter incorporating the principles of the present invention.

A controlled current limiter is illustrated in FIG. 3 showing an input transistor Q1 having its base connected to the input terminal to receive the current from an operational amplifier and its collector-emitter path connected between the source terminal $V_{CC}$ and the output terminal $V_{OUT}$. A current limiting transistor Q2 has its collector connected to the input terminal $I_{IN}$, its emitter connected to the output terminal $V_{OUT}$ and its base connected to a voltage divider. The voltage divider includes the resistor R1 in series with R2 connected between the base of the limiting transistor Q2 and the emitter or output terminal. The emitter of the input transistor Q1 is connected to the juncture of the resistors R1 and R2. Connected in series between the base of the limiting transistor Q2 and the source terminal $V_{CC}$ is a zener diode Z2 and a series resistor R3. The resistor R1 is of very small value for example 10 ohms while resistors R2 and R3 are larger.

Figure 1:
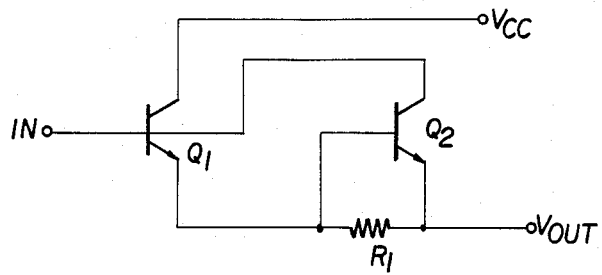
FIG. 1 is a schematic of a current limiter of the prior art.
Figure 2:
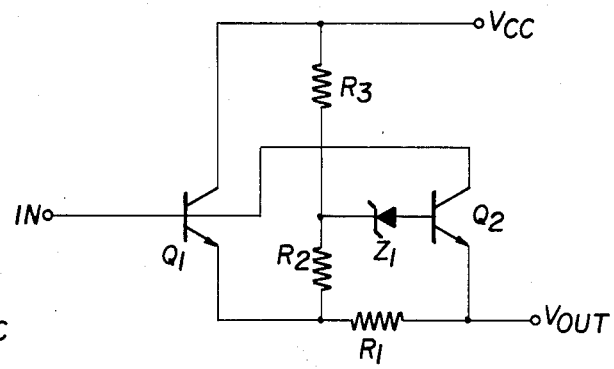
FIG. 2 is a schematic of an improved current limiter of the prior art.

The current limiter Q2 operates as in FIG. 1, namely turning on when the voltage across R1 exceeds $V_{BE}$ of Q2, until the breakdown voltage of the zener diode transistor Z2 is exceeded, the voltage divider R1 and R2 in combination with R3 provide a voltage divider for the limiting transistor Q2 which is responsive to the voltage difference between the source terminal $V_{CC}$ and the output terminal $V_{OUT}$. As this difference increases the output current decreases. During idle time when the current limiter is not in use, the breakdown voltage of zener diode Z2 is selected to prevent any power dissipation through the voltage dividers R2 and R3.

Figure 4:
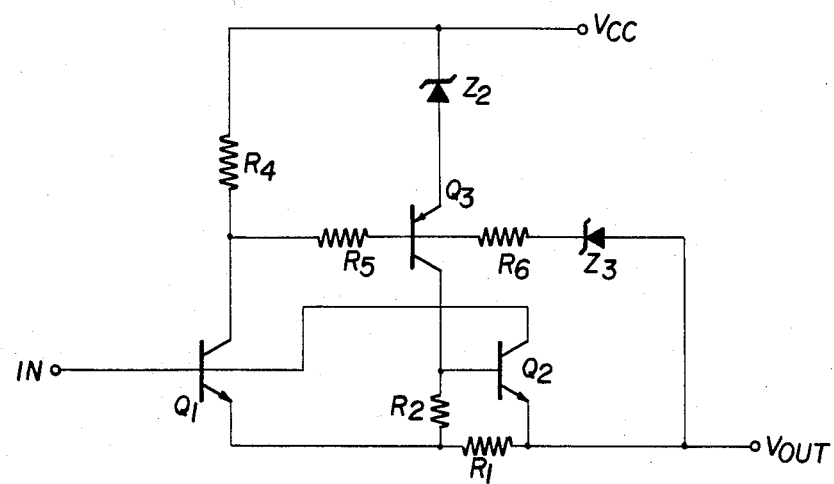
FIG. 4 is a schematic of a second embodiment of a current limiter incorporating the principle of the present invention.

Another embodiment illustrated in FIG. 4 includes a resistor R4 in the collector-emitter path of the output transistor Q1 to provide a point at which the output current can be sensed since it is substantially equivalent to the current through the resistor R4. Connected in series with the zener diode Z2 is a transistor Q3 having its collector-emitter path connected between the diode Z2 and the base Q2 of the limiting transistor. The base of the transistor Q3 is connected to the collector emitter path of transistor Q1 by resistor R5. A second zener diode Z3 and a series resistor R6 connects the output terminal $V_{OUT}$ with the base of the transistor Q3. The zener diode Z2 operates as it did in the embodiment of FIG. 3 in that the voltage divider path to the base of Q2 is not operable until a minimum voltage difference source voltage $V_{CC}$ and the output voltage $V_{OUT}$ is achieved.

The transistor Q3 operates as a switch responsive to the output current by sensing the voltage across resistor R4 to vary the biasing of the base of current limiting transistor Q2. The switching transistor Q3 is turned on when the current through R4 produces the voltage which is greater than the sum of the breakdown voltage of the zener Z2 and the emitter base voltage Q3. The ability of the transistor Q2 to limit output current varies with the difference between the source voltage $V_{CC}$ and $V_{OUT}$ once the switching transistor Q3 is activated and Z2 is conducting. For increasing voltage differences, the limiting transistor Q2 decreases the output current of Q1.

As the difference of the source voltage $V_{CC}$ and the output $V_{OUT}$ exceeds the breakdown voltage of the zener diode Z3, it becomes conductive resulting in resistors R5 and R6 acting as a voltage divider. This in effect biases up the base of the switching transistor Q3 thereby reducing the current through the resistor R4 at which the transistor Q3 will become operable to activate the current limiter Q2. Typical breakdown voltages for the zener diode Z2 is 5 volts and the breakdown voltage for Z3 is 20 volts. The typical value for R4 is 65 ohms a typical value of R5 is about a 1,000 ohms, and a typical value for R6 is about 33,500 ohms.

Figure 5:
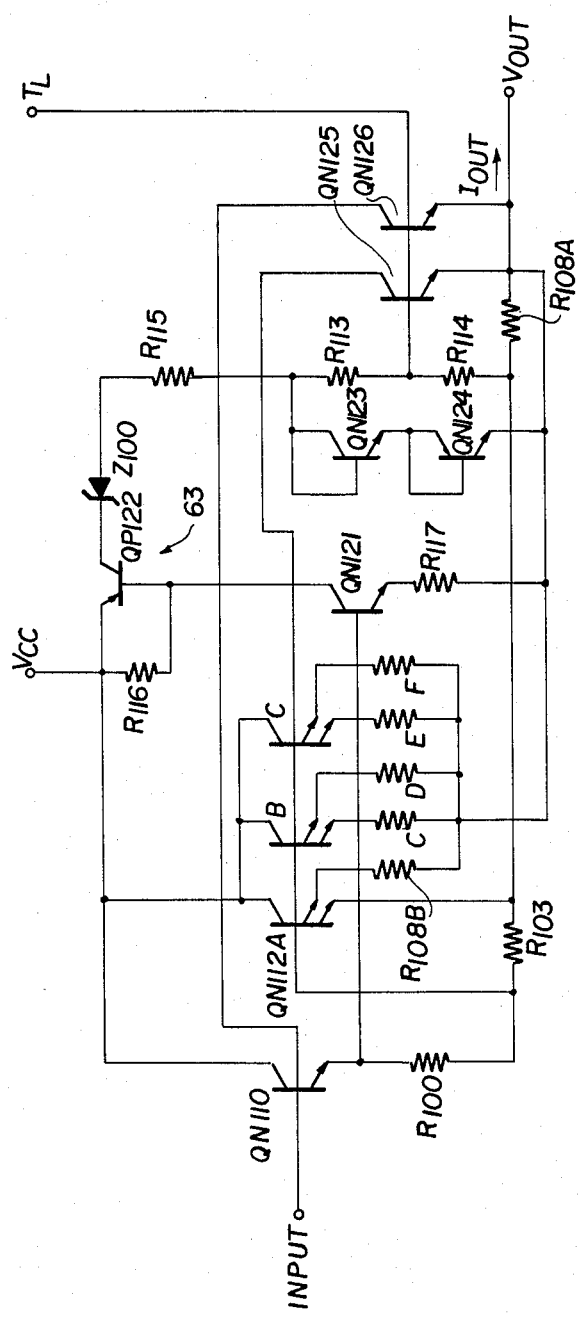
FIG. 5 is a schematic of a third embodiment of a current limiter incorporating the principle of the present invention.

FIG. 5 shows another preferred embodiment of the present invention including a first input transistor QN110 having its base as the input of the circuit and its collector-emitter path as connected between the source terminal $V_{CC}$ and $V_{OUT}$ through resistors R100, 103 and 108 A. A plurality of multi emitter transistors QN112 A, B, and C have their collectors connected to the source terminal $V_{CC}$ and their emitters connected through emitter resistors R108 B-F to the output terminal $V_{OUT}$ except for one of the emitters of transistor QN112A. This emitter is connected to the juncture of the resistor R103 and R108A. A switching transistor QN121 has its collector-emitter path connected between the source terminal $V_{CC}$ and the output terminal $V_{OUT}$ via resistors R116 and R117 and its base connected to the emitter collector path of the input transistor QN110.

A current limiting transistor QN125 has its collector connected to the base of transistors QN112 and its emitter connected to the output terminal $V_{OUT}$. The base of the current limiting transistor QN125 is connected to a voltage divider including resistors R113 and R114. Connected in series with the voltage divider including resistor R113 is a diode Z100, series resistor R115 and the collector emitter path of switching transistor QP122. The base of transistor QP122 is connected to the collector emitter path of switching transistor QN121.

A second current limiting transistor QN126 has its collector-emitter path connected to the base of the input transistor QN110 and the output terminal $V_{OUT}$. The base of the current limiting transistor QN126 is connected to the voltage divider including resistors R113 and R114 and R108A. Two series transistors, having their bases shorted to their collectors, QN123 and QN124 form effectively a diode and clamps the top of the voltage divider R113 to the output terminal $V_{OUT}$. Terminal $T_L$ provides input current to the bases of the limiting transistors QN125 and QN126 as a function of excessive chip temperature to further limit the current.

The operation of the schematic FIG. 5 is similar to that of FIG. 4 when one considers the combination of input transistors and current limiting transistors. Current limiting transistors QN125 is a current limiter for QN112A and current limiting transistor QN126 is a current limiter for the input transistor QN110. The switching transistor Q3 of FIG. 4 has been replaced by the combination of switching transistors QP122 and QN121. The current limiting transistor QN125 suppresses the base current drive from QN112 A-C when the voltage drop across R114 and R108A exceeds the base emitter voltage. During idle conditions when the output current is below for example, 100 microamps, the voltage across R103 and R100 are lower than the voltages needed to turn on the transistors QN112 and QN121 respectively. With switching transistor QN121 off, the switching transistor QP122 in series with the zener diode Z100 is off and no current flow will flow through R115 and Z100. Thus power is conserved through the voltage divider for the current transistors QN125 and QN126.

When the output must deliver more then for example, 1 milliamp, the input transistor QN110 provides a current to produce a voltage across resistor R103 large enough to turn on QN112 A-C at which time the switching transistor QN121 is also turned on. With switching transistor QN121 turned on, enough current is provided through resistor R116 to turn on and drive switching transistor QP122 into saturation. Thus for a given output current value, the voltage divider to the current limiting leg is enabled. When the voltage difference between the source terminal $V_{CC}$ and the output terminal $V_{OUT}$ exceeds the breakdown voltage of Z100 which maybe for example 20 volts, resistors R115, 113, 114 form a voltage divider for the base of limiting transistors QN125 and QN126. As in the previous examples this voltage divider allows the current limiting transistors QN125 and QN126 to turn on for less and less output current as the difference between the source voltage $V_{CC}$ and the output voltage $V_{OUT}$ increases.

In certain applications it is desirable that the output current be limited to a fixed value for very high values of the difference between the source voltage $V_{CC}$ and the output voltage $V_{OUT}$. When this predetermined difference is reached, the transistors QN123 and QN124 turn on clamping the output $V_{OUT}$ directly to resistors R115 and bypassing the voltage divider R113 and R114. As discussed previously, temperature sensor monitors the chip temperature and delivers several milliamps of current to the terminal $T_L$ to turn on the current limiting transistors QN125 and QN126 to limit the current even further should the chip temperature become excessively high.

Figure 6:
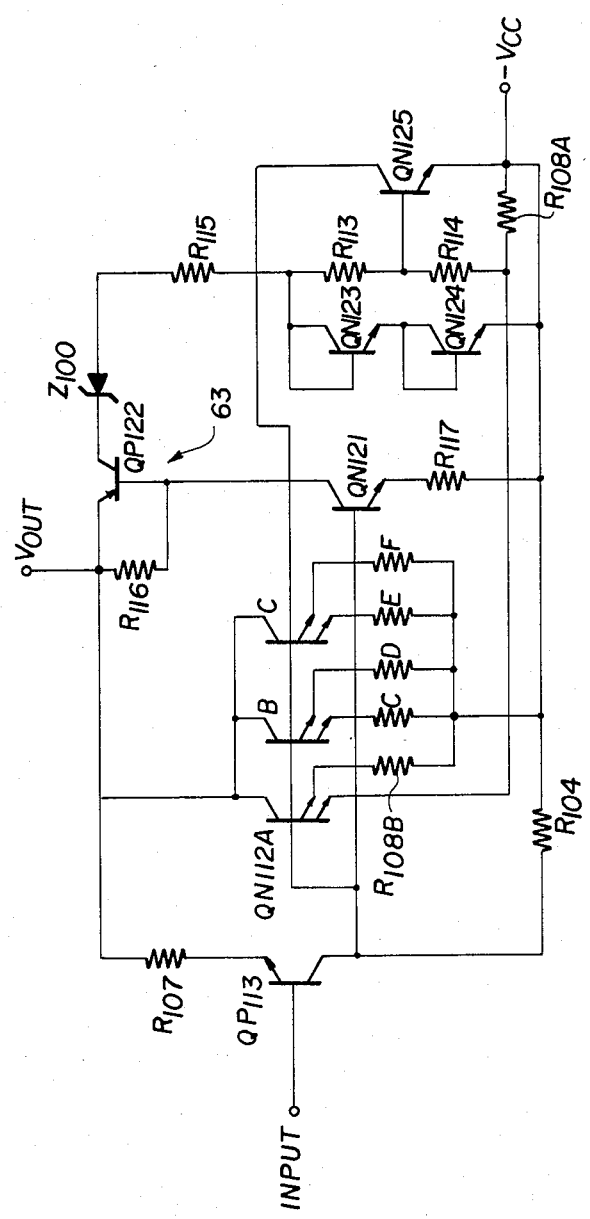
FIG. 6 is a schematic of a fourth embodiment of a current limiter incorporating the principle of the present invention.

The circuit of FIG. 5 is designed for positive input of voltage and current and FIG. 6 is designed for a negative input currents. The elements having the same purpose and function of FIG. 6 have the same numbers as FIG. 5. The major difference is that the input transistor QN110, which is a NPN transistor in FIG. 5, has been replaced by a PNP transistor QP113 in FIG. 6. Similarly transistor R100 and R103 have been replaced by a single resistor R104 and a resistor R107 have been placed in the collector emitter path of the input transistor QP113. It should be noted that the output terminal and the source terminal has been reversed. The importance is that the current flow be between the two terminals with the input being provided on a third terminal as a control input to vary the current between the two terminals signified as $V_{CC}$ and $V_{OUT}$.

From the preceding description of the preferred embodiments, it is evident that the objects of the inventions are obtained and although the invention has been described and illustrated in detail it is to be clearly understood that the same is by way of the illustration and example only and is not to be taken by way of the limitation. The spirit and scope of this invention are to be limited only be the terms of the appended claims.

What is claimed is:

1. A controlled current limiter comprising:
   an input, first and second terminals;
   a first transistor having a base connected to said input terminal, a collector connected to said second terminal and an emitter;
   a second transistor having a collector connected to said base of said first transistor, an emitter connected to said first terminal and a base;
   a voltage divider having a first end point connected to said base of said second transistor, a second end point connected to said first terminal and an intermediate point connected to said emitter of said first transistor;
   a diode connected between said second terminal and said first end point of said voltage divider for preventing current flow through said voltage divider until the voltage difference between said first and second terminals exceed the breakdown voltage of said diode; and
   a switch means in series with said diode and having a control electrode connected to the collector-emitter path of said first transistor for connecting said diode in series between said second terminal and said first end of said voltage divider at a preselected current in said first transistor's collector-emitter path.

2. A controlled current limiter according to claim 1 wherein said switch means includes a third transistor having a emitter-collector path in series with said diode and a base connected to the emitter-collector path of said first transistor.

3. A controlled current limiter according to claim 2 including a second diode and series resistor in series between said base of said third transistor and said first terminal for biasing up said base of said third transistor when the voltage difference between said first and second terminals exceed the breakdown voltage of said second diode which is higher then the breakdown voltage of said first mentioned diode.

4. A controlled current emitter limiter according to claim 1 wherein said switch means includes a third transistor having an emitter-collector path in series with said diode and having a base, a fourth transistor having emitter-collector path connected between said first and second terminals and having a base, said base of said third transistor being connected to said emitter-collector path of said fourth transistor, a fifth transistor having an emitter-collector path connected between said first and second terminals and having a base connected to said input terminal, said base of said first transistor is connected to said input terminal through said fifth transistor, and said base of said fourth transistor being connected to said emitter-collector path of said fifth transistor.

5. A controlled current limiter according to claim 1 including clamp means connected in parallel to said first and second end points of said voltage divider to limit the current between said first and second terminals to a fixed value when the voltage difference between said first and second terminals exceed a predetermined value greater than said breakdown voltage of said diode.

* * * * *